United States Patent [19]

Heinz et al.

[11] 4,320,188

[45] Mar. 16, 1982

[54] PHOTOPOLYMERIZABLE COMPOSITIONS CONTAINING ELASTOMERS AND PHOTO-CURABLE ELEMENTS MADE THEREFROM

[75] Inventors: Gerhard Heinz, Weisenheim; Peter Richter, Frankenthal; Mong-Jon Jun, Speyer, all of Fed. Rep. of Germany

[73] Assignee: BASF Aktiengesellschaft, Fed. Rep. of Germany

[21] Appl. No.: 197,790

[22] Filed: Oct. 17, 1980

[30] Foreign Application Priority Data

Oct. 18, 1979 [DE] Fed. Rep. of Germany ....... 2942183

[51] Int. Cl.³ .............................................. G03C 1/68
[52] U.S. Cl. .................................... 430/281; 430/286; 430/905; 430/910; 204/159.15; 204/159.22
[58] Field of Search ............... 430/281, 286, 905, 910; 204/159.15, 159.22

[56] References Cited

U.S. PATENT DOCUMENTS

| | | |
|---|---|---|
| 2,948,611 | 8/1960 | Barney . |
| 3,024,180 | 3/1962 | McGraw . |
| 3,674,486 | 7/1972 | Milgrom . |
| 3,798,035 | 3/1974 | Varga et al. . |
| 3,951,657 | 4/1976 | Recchia et al. . |
| 4,162,919 | 7/1979 | Richter et al. . |
| 4,179,531 | 12/1979 | Hein .................................. 430/286 |

FOREIGN PATENT DOCUMENTS

| | | |
|---|---|---|
| 2138582 | 2/1973 | Fed. Rep. of Germany . |
| 2364873 | 8/1974 | Fed. Rep. of Germany . |
| 2215090 | 11/1974 | Fed. Rep. of Germany . |
| 2223808 | 5/1975 | Fed. Rep. of Germany . |
| 2610206 | 8/1977 | Fed. Rep. of Germany . |
| 2815678 | 10/1978 | Fed. Rep. of Germany . |
| 2720228 | 6/1979 | Fed. Rep. of Germany . |
| 2631837 | 9/1979 | Fed. Rep. of Germany . |
| 2939989 | 4/1980 | Fed. Rep. of Germany . |

*Primary Examiner*—Jack P. Brammer
*Attorney, Agent, or Firm*—Keil & Witherspoon

[57] ABSTRACT

Photopolymerizable compositions based on an elastomeric styrene-diene block polymer, one or more photopolymerizable olefinically unsaturated monomers and one or more photopolymerization initiators exhibit improved properties if they contain, as an essential constituent, an elastomeric block copolymer of the general structure A-B-C, where A is a thermoplastic, non-elastomeric polymer block based on styrene compounds and having a second order transition point above +25° C., B is an elastomeric polymer block based on butadiene and/or isoprene and having a second order transition point below −20° C. and C is a polymer block, different from B, having a second order transition point of from −30° C. to +15° C., C being either a homopolymer or copolymer block based on butadiene or isoprene or a random copolymer block based on conjugated dienes and styrene compounds. The photopolymerizable compositions may be used, inter alia, for the production of photo-curable adhesives, resilient and flexible sheet material and, in particular, flexographic relief printing plates.

10 Claims, No Drawings

PHOTOPOLYMERIZABLE COMPOSITIONS CONTAINING ELASTOMERS AND PHOTO-CURABLE ELEMENTS MADE THEREFROM

The present invention relates to advantageous, photopolymerizable compositions for the production of photocurable adhesives, resilient and flexible sheet material, and relief plates, based on a mixture of ethylenically unsaturated monomers, an elastomeric diene block copolymer of the structure ABC, and a photoinitiator.

Photopolymerizable compositions for the production of articles such as relief plates for flexographic printing are known per se and are described, for example, in German Laid-Open Application DOS No. 2,138,582, DOS No. 2,215,090, DOS No. 2,223,808, DOS No. 2,364,873, DOS No. 2,610,206, DOS No. 2,631,837, DOS No. 2,720,228 and DOS No. 2,815,678 and in U.S. Pat. Nos. 2,948,611, 3,024,180, 3,674,486, 3,798,035 and 3,951,657. However, in practice, the prior art compositions are not entirely satisfactory. For example, some of the relief plates produced from these compositions exhibit inadequate flexibility and resilience, and excessive hardness, whilst others, under relatively high shearing stress, high contact pressure and rapid dynamic stress, tend to exhibit plastic deformation and cold flow, and hence differ adversely from vulcanized rubber in conventional rubber plates. Yet another group of the relief plates produced from the conventional compositions exhibits only limited stability to certain solvents present in flexographic inks.

German Laid-Open Application Dos No. 2,215,090, DOS No. 2,223,808, DOS No. 2,815,678 and DOS No. 2,610,206 disclose the use, as polymers in photopolymerizable compositions for relief-forming layers, of elastomeric block copolymers of the A-B-A type which possess an elastomeric block between two thermoplastic non-elastomeric blocks, for example styrene-isoprene-styrene or styrene-butadiene-styrene three-block copolymers. The disadvantage of using such block copolymers resides not only in the fact that they are difficult to prepare with accurately reproducible properties on each occasion, but also in the fact that both the solutions of the photopolymerizable compositions, used to prepare the photopolymerizable layers, and the non-exposed compositions in the layers themselves, are frequently very hazy. Haze in photosensitive layers is known to cause light scattering, which very adversely influences the quality of reproduction of the photographic transparency on the finished printing plate. In particular, negative image sections (typographical reverses and cells) frequently do not develop adequately, and the shoulders of relief areas are convex, which causes shifts in tonal values on printing.

It is an object of the present invention to provide suitable polymerizable compositions for, in particular, the production of relief plates for flexographic printing, which plates show the disadvantages of conventional photosensitive layers to a lesser extent, if at all, and are based on polymers which can be prepared simply, economically and with readily reproducible properties, from which mixtures photopolymerizable layers can be produced, by conventional casting, compression-molding and extrusion methods, which, in the non-cross-linked state, are readily soluble in conventional developer solutions and give, after exposure and washing out, relief printing plates which give printed copies which faithfully reproduce the original, have a long press life and have good resistance to conventional ink solvents.

We have found that photopolymerizable compositions which contain (a) not less than 40% by weight of one or more elastomeric block copolymers which are soluble in developer solutions and possess a thermoplastic non-elastomeric polymer block A and an elastomeric diene polymer block B, (b) not less than 1% by weight of one or more photopolymerizable olefinically unsaturated monomers compatible with the block copolymer (A), and (c) from 0.1 to 10% by weight of one or more photopolymerization initiators, exhibit the desired properties if the block copolymer (a) is an elastomeric block copolymer having the structure A-B-C, in which (a1) the polymer block A, accounting for from 5 to 25% by weight, preferably from 7 to 20% by weight, of the block copolymer, is prepared from one or more styrene monomers of the formula $CH_2=CRR'$ where R is hydrogen or methyl and R' is phenyl or $C_1-C_4$-alkyl-substituted phenyl, and has a second order transition point about $+25°$ C., (a2) the polymer block B which accounts for from 15 to 90% by weight of the block copolymer is prepared from one or more aliphatic diene hydrocarbons of 4 or 5 carbon atoms and has a second order transition point below $-20°$ C., and (a3) the polymer block C which accounts for from 5 to 60% by weight of the block copolymer is prepared by homopolymerization or copolymerization of one or more aliphatic diene hydrocarbons of 4 or 5 carbon atoms and has a second order transition point of from $-30°$ C. to $+15°$ C. and preferably from $-20°$ C. to $+10°$ C.

Photopolymerizable compositions according to the invention, containing the specific three-block copolymers, exhibit a number of advantages when used in practice. Compared to commercial similar three-block copolymers A-B-A, the polymers to be employed according to the invention give water-clear solutions in toluene, with little intrinsic absorption in the wavelengh range of from 300 to 400 μm. The same is true of the films prepared therefrom, which are free from haze, a feature of great importance particularly in the preparation of photopolymer relief printing plates. Hazy, light-scattering polymer films in photopolymerizable layers prevent the formation of clean, sharply defined edges of the relief image at the boundary between exposed and unexposed areas and instead cause the shoulders to bow outwardly, with the consequence that the printed copy obtained is not sharp, the printing surfaces are broadened, and consequently shifts in tonal value occur. Negative image areas, i.e. lines, text matter or illustrations in solids, plug with printing ink and are no longer recognizable in the printed result. The extraordinary clarity of layers produced with the photopolymerizable mixtures according to the invention, containing the specific block copolymers described, has the further advantage that the relief printing plates produced therefrom can be made with very considerable relief heights coupled with straight side walls, as is necessary for printing rough and wavy surfaces such as corrugated board, cardboard and napkin paper. Relief heights of more than 3 mm are readily obtainable, as with conventionally molded rubber plates, without polymerization occurring in the deepest portions adjacent to the exposed areas. It is an advantage that the structure A-B-C of the block copolymers in the novel photopolymerizable compositions permits the polymer structure to be adapted very closely to the desired mechanical properties of the photocrosslinked layer. Thus, when the compositions according to the invention are used to prepare the bases for multi-layer plates, it is preferred to use polymers which have a low intrinsic viscosity and a short block C consisting of a random isoprene-styrene copolymer, and which, because of their low melt viscosity, can very advantageously be processed by extruding, calendering or compression-molding. The specific block copolymers used in the compositions according to the invention furthermore show good feed characteristics in particulate form, which is of great advantage for feeding extruders and dispenses with the use of anticaking agents.

The elastomeric block copolymer to be employed according to the invention has the structure A-B-C, where A, B and C are different polymer blocks, linked chemically to one another. The following may be noted concerning the structure of the block copolymer:

Examples of suitable styrene monomers of the formula $CH_2=CRR'$, where R and R' have the stated meanings, are α-methylstyrene, vinyltoluenes, tert.-butyl-styrene and especially styrene itself. The polymer block A is preferably a homopolymer or copolymer block based on the said styrene monomers, and more especially a polystyrene block.

Preferred aliphatic diene hydrocarbons of 4 or 5 carbon atoms are butadiene and isoprene. To prepare the polymer block B, the diene hydrocarbons may be employed individually or as mixtures with one another. Accordingly, the polymer block B is preferably a butadiene homopolymer block, an isoprene homopolymer block or a butadiene-isoprene random copolymer block.

The block C which accounts for from 5 to 60% by weight of the block copolymer A-B-C is a homopolymer or copolymer block having a second order transition point of from +15° C. to −30° C., preferably from +10° C. to −20° C. Examples of suitable homopolymer blocks are polybutadiene blocks of more than 70% by weight 1,2-configuration and polyisoprene blocks of more than 40% by weight 3,4-configuration, the blocks preferably having a mean molecular weight of from 10,000 to 90,000.

In a further embodiment, block C can be a random copolymer of the aliphatic diene hydrocarbons of 4 or 5 carbon atoms, such as butadiene or isoprene, and the styrene monomers of the formula $CH_2=CRR'$, such as those mentioned above, the proportion of diene hydrocarbons present as copolymerized units in the block C advantageously being from 70 to 30% by weight, especially from 60 to 30% by weight, and the proportion of the styrene monomers present as copolymerized units in the block C advantageously being from 30 to 70% by weight, especially from 40 to 70% by weight, based on the block C; the proportion is limited by the required second order transition point, which, for the random copolymer, is preferably from −20° to +10° C. The total proportion of block C in the block copolymer A-B-C is, for such a copolymer, preferably from 5 to 35% by weight, based on the block copolymer A-B-C.

For certain applications, and for improved oxidation resistance and aging resistance, the block copolymers described can be partially hydrogenated, in particular selectively hydrogenated.

Very suitable block copolymers A-B-C for use in the novel compositions have intrinsic viscosities, measured on 0.5 percent strength by weight solutions in toluene at 25° C., of from about 60 to 350 ml/g and especially from 90 to 180 ml/g, corresponding to a mean molecular weight range $\overline{M}_v$ of from about 100,000 to 200,000.

Block copolymers of the above type can be prepared by sequential anionic polymerization, in a conventional manner known per se.

Depending on the particular end use, it is of course also possible to use mixtures of block copolymers of the stated type, or to mix the block copolymers with minor amounts of other, compatible polymers and especially of elastomers.

The specific block copolymers A-B-C required for the novel photopolymerizable compositions and photocurable elements prepared therefrom possess, by virtue of their structure, little or no physical crosslinking, as evidenced by their low hardness and substantial plastic deformability. Block copolymers ABC in which the polymer block C is incompatible with the polymer block A are very suitable. Exposure of layers which contain the photopolymerizable compositions according to the invention (with monomers and photoinitiator) improves the mechanial properties to such an extent that they match those of vulcanized rubber, so that the materials are exceptionally suitable for use as, for example, relief printing plates for flexographic printing. The photochemical crosslinking results in an increase in hardness, the hardness being variable within wide limits by appropriate choice of the amount, nature and functionality of the added monomers and by varying the exposure intensity. At the same time, the resilience measured, for example, as the impact resilience, of the crosslinked exposed layers is substantially greater than that of the non-crosslinked layers, so that in practice no difference in recovery and deformation characteristics, compared to conventional vulcanized rubber in the form of relief printing plates can be found. As far as handling of the non-crosslinked, unexposed layers of the novel compositions is concerned, it is of course advantageous to formulate compositions whose cold flow, or tendency to undergo plastic deformation, suits the particular end use. For example, for use in the production of printing plates, a composition according to the invention containing a block copolymer having an intrinsic viscosity of up to 110 ml/g and a monomer content of, preferably, from 5 to 20% by weight, is particularly suitable. In such a composition, the hardness, impact resilience, modulus of elasticity and stress-elongation curve can be additionally varied, in accordance with requirements, via the length, and chemical composition, of the blocks A, B and C in the block copolymer. High hardness coupled with low intrinsic viscosities are achieved, for layers of photopolymerizable compositions, if the length of the blocks A and C in the block copolymer is greatly increased or if the block B in the block copolymer contains butadiene instead of isoprene.

Very suitable photopolymerizable compositions according to the invention contain from 60 to 99% by weight, and especially from 70 to 95% by weight, of the block copolymer (a) and from 1 to 40% by weight, and especially from 5 to 30% by weight, of monomers. Particular examples of monomers which are compatible with the block copolymer and possess one or more polymerizable C-C double bonds are esters of acrylic acid and/or methacrylic acid with monohydric or polyhydric alcohols, such as butyl acrylate, butyl methacrylate, 2-ethylhexyl acrylate, lauryl acrylate, lauryl methacrylate, ethylene glycol dimethylacrylate, butane-1,4-diol diacrylate, butane-1,4-diol dimethacrylate, neopentylglycol dimethacrylate, 3-methylpentanediol diacrylate, 2-hydroxypropyl acrylate, 2-hydroxyethyl methacrylate, hexane-1,6-diol diacrylate, hexane-1,6-diol dimethacrylate, 1,1,1-trimethylolpropane, triacrylate, and trimethacrylate, diethylene glycol, triethylene glycol and tetraethylene glycol diacrylate, tripropylene glycol diacrylate and pentaerythritol tetraacrylate. Vinyl esters of aliphatic monocarboxylic acids, eg. vinyl oleate, and vinyl ethers of alcohols, eg. octadecyl vinyl ether or butane-1,4-diol divinyl ether, are also suitable. The properties of the novel photopolymerizable compositions can be modified, to suit a specific purpose, by appropriate choice of the monomers or monomer mixtures.

The photopolymerizable composition furthermore contains a photoinitiator, or a mixture of photoinitiators, in an amount of from 0.01 to 10% by weight, especially from 0.1 to 5% by weight, for example benzoin, benzoin derivatives, eg. benzoin methyl ether, isopropyl ether, n-butyl ether or isobutyl ether, symmetrically or unsymmetrically substituted benzil ketals, eg. benzil dimethyl ketal, or other conventional photoinitiator systems.

To prevent thermal polymerization of the monomers, the compositions according to the invention may contain inhibitors, such as p-methoxyphenol, hydroquinone, 2,6-di-tert.-butyl-para-cresol or other commercial inhibitors. A precondition in selecting such inhibitors is that they should have no significant intrinsic absorption in the actinic region in which the photoinitiator used in the same composition absorbs. The use of inhibitors as antioxidants preventing oxidative degradation of rubber is particularly advantageous in compositions according to the invention in which the block copolymers A-B-C have polymer blocks B consisting predominantly or solely of butadiene.

Conventional rubber processing additives, such as plasticizers, may be used to control the hardness of the novel photopolymerizable compositions and elements. For example, the addition of certain amounts of paraffin oils which act as plasticizers results in resilient and flexible layers having good recovery, which can be used as the base layer for multi-layer flexographic plates, as described in German Laid-Open Application DOS No. 2,444,118. The addition of styrene oligomers, low molecular weight styrene copolymers, random styrene/butadiene copolymers having high styrene contents and α-methylstyrene copolymers increases the hardness of the exposed layers.

Furthermore, dyes and photochromic additives can be introduced into the photopolymerizable compositions to control the exposure characteristics.

The surface tackiness which is known to arise on exposing layers of photopolymerizable mixtures, containing acrylic acid esters and methacrylic acid esters, if there is access of oxygen, can be utilized where the novel compositions are employed as adhesive layers, and be accentuated by suitable formulations. Commercial resins such as hydrocarbon resins, rosin esters, polyterpenes, coumarone-indene resins and the like may be used as tackifying additives. Preferred crosslinking monomers for this application are difunctional or polyfunctional methacrylic acid esters, used alone or as a mixture with monofunctional acrylic acid esters. The photochemical crosslinking results in adequate solvents resistance, which is necessary for certain applications of such adhesive layers, for example for relief printing plates which are developed by washing out with solvents.

The novel compositions are distinguished by good processability, for example in the production of layers. The compositions can be produced by conventional methods and be processed into layers of any desired thickness. For example, layers of the compositions can be produced from solutions in suitable solvents (such as toluene, xylene, cyclohexane, tetrahydrofuran, methyl isobutyl ketone or tetrachloroethylene) by casting on appropriate bases; this is easily carried out because of the fact that the block copolymers used in the novel compositions have low solution viscosities and readily permit thorough homogenization of the components of the composition in solution. Equally, layers can be produced by pressure-molding, extruding and calendering, and if the inhibitor is suitably chosen no incipient thermal crosslinking will occur in these processes.

The thickness of the layer can easily be varied to suit the particular application; for photopolymerizable elements intended for recording purposes, such as printing plates, the thickness is from 0.01 to 6.5 mm.

Suitable bases for photo-curable elements are flexible materials (such as metal sheets or foils, and sheets of high molecular weight polymers such as polyethylene terephthalate, polybutylene terephthalate, nylon or polycarbonate) which have a sufficiently high modulus of elasticity to be suitable for use as a dimensionally stable base for the particular application of the element. The choice of base is not confined to sheets or foils; woven fabrics or nonwovens, for example glass fiber fabrics, can serve as the base. In addition to achieving good anchorage of the photopolymerizable layer to a very strong and dimensionally stable base, it is possible—in order to obtain thicker plates, the thickness corresponding to that of conventional rubber plates—to employ other resilient and flexible substrates which in turn are firmly bonded to a dimensionally stable base. For example, for multi-layer plates, it is possible to use a resilient and flexible base, such bases being described in German Laid-Open Application DOS No. 2,444,118.

For printing plates in which the relief-forming layers are from 3.0 mm to 6.5 mm thick, plates without a stabilizing layer, having a high modulus of elasticity, according to German Laid-Open Application DOS No. 2,444,118 are more suitable, since certain techniques of mounting the plate are usual in practice, where the plate is adhered flat, by means of a double-coated adhesive film, to a register sheet and is then clamped on the press cylinder. Plates of such thicknesses can, for example, be prepared by laminating individual layers of photopolymerizable materials to one another, utilizing their natural intrinsic tackiness, or using solvents which dissolve the surface of the layers. To achieve special printing properties, layers with different hardnesses and based on different formulations may be used in such laminates. Equally, single-layer plates can be extruded, calendered or compression-molded in a single process step, using conventional techniques.

The adhesive layers between layers of the novel compositions and the base may consist of commercial one-component or two-component adhesives, the nature of which depends on the base material, and on the nature and formulation of the photopolymerizable composition applied thereto. Examples of adhesives which are frequently used are commercial reactive adhesives based on polyurethane or polychloroprene; these may be applied in a suitable thickness, by coating or casting, to the layers to be bonded.

Further advantageous photo-curable elements possessing a layer of a composition according to the invention are those which possess elastomeric bases, according to German Laid-Open Application DOS No. 2,444,118, having a Shore A hardness of from 15 to 70 and especially of from 25 to 40, this hardness being greater than or equal to the hardness of the photopolymerizable layer in the photo-crosslinked state. The base can be prepared from the same base polymer as the photopolymerizable layer, the hardness being adjusted, to give optimum printing properties, by appropriate addition of a plasticizer such as a paraffinic or naphthenic oil, and the base layer being photo-crosslinked by exposing it over its entire surface. Other suitable elastomeric materials may also be employed for the base. In general, the base is from 0.5 to 6 mm, especially from 1 to 4 mm, thick.

Multi-layer photo-curable elements particularly suitable for printing possess a stabilizing layer, as described in German Laid-Open Application DOS No. 2,444,118, between a relief-forming layer of the novel composition and a soft, resilient base of the type mentioned above.

It is often advantageous if, in photo-curable elements, the layer of the novel composition is additionally covered with a firmly adhering, thin, non-tacky covering layer, which preferably consists of a polymer which forms hard, non-tacky, transparent and tear-resistant films, form example a nylon, nylon copolymer, polyurethane or rubber having a high degree of cyclization which is soluble in the developer solution used. The thickness of this covering layer is advantageously from about 0.5 to 20 μm. When producing the relief printing plate, this covering layer for example enables the negative to be placed flat on the unexposed plate, without sticking thereto or the formation of bubbles; this is sometimes impossible in the absence of the covering layer because of the surface tackiness of the layer of photopolymerizable composition. When developing the exposed areas of the layer to form the relief, the covering layer is usually washed out together with the non-crosslinked areas of the photopolymer layer.

It is furthermore often advantageous additionally to provide the covering layer with a protective film, e.g. a polyester film, which can be peeled off; it is also possible to apply this film conjointly with the covering layer to the photopolymerizable layer. The protective film is in general peeled off before imagewise exposure of the photopolymerizable layer, whilst the covering layer is in general left in position during exposure.

Using conventional methods, layers of the compositions according to the invention can be converted, by exposure, into crosslinked and insoluble molded articles; for example, they can be converted into relief plates which are particularly suitable for flexographic printing, by imagewise exposure of the layer and subsequent removal of the unexposed and non-crosslinked areas of the layer, in particular by wash-out with a developer solution. The conventional sources of actinic light, such as commercial ultraviolet fluorescent tubes or high-pressure mercury vapor lamps, may be used for the exposure, which may be effected in flat-plate, rotary or cylindrical exposure units. The emitted wavelength of the light source should preferably be from 300 to 400 μm or should match the intrinsic absorption of the photoinitiator contained in the photopolymerizable layer. Examples of suitable developer solutions for washing out the non-crosslinked areas of the layer in order to develop the relief, are chlorohydrocarbons, eg. 1,1,1-trichloroethane, sym. tetrachloroethane and tetrachloroethylene, hydrocarbons, eg. hexane or toluene, or other organic solvents, eg. methyl isobutyl ketone; mixtures of such solvents with lower alcohols may also be used, the latter component serving to control the wash-out time.

In the Examples which follow, parts and percentages are by weight, unless stated otherwise. Parts by volume bear the same relation to parts by weight as the liter to the kilogram. The intrinsic viscosities (ml/g) quoted were determined by a method based on DIN 51,562 and DIN 53,726, at 25° C., using 0.5% strength by weight solutions of the polymers in toluene. The quoted molecular weights $\overline{M}_v$ are weight averages determined from the intrinsic viscosity.

The Shore A hardness was determined in accordance with DIN 53,505.

The impact resilience was measured according to DIN 53,512.

The second order transition point $T_G$ was determined according to DIN 53,520.

The elongation at break was determined according to DIN 53,504.

EXAMPLE 1

A block copolymer ABC 1 with 10% of polystyrene as block A, 70% of polyisoprene, having a second order transition point $T_G$ of $-53°$ C., as block B, and 20% of polyisoprene, with 53% by weight 3,4-configuration, and having a second order transition point $T_G$ of $+10°$ C., as block C, is used. The block copolymer ABC 1 has an intrinsic viscosity of 164.9 ml/g, a total molecular weight $\overline{M}_v$ of 190,000 and an impact resilience of 53%.

440 parts of block copolymer ABC 1, stabilized with 0.5% of 2,6-di-tert.-butyl-p-cresol, 35 parts of hexane-1,6-diol diacrylate, 6.5 parts of benzil dimethyl ketal and 0.04 part of a black dye (C.I. 26,150, Solvent Black 3) are dissolved in toluene to give a 50% strength solution and the latter is cast on a polyester film, the thickness of solution applied being such that after drying for one hour at 80°–90° C. an 0.7 mm thick dry film is left. The polyester film has beforehand been coated with an about 2 μm thick layer of highly cyclized rubber. This layer enables the photopolymerizable layer to be removed from the polyester film, the cyclized rubber layer remaining on the photopolymerizable layer. A futher polyester film, serving as base, is coated with a commercial polyurethane adhesive, and the coated side is applied to the free side of the photopolymerizable layer using a squeegee roller.

After the first polyester film has been removed, a photographic negative is placed on the photopolymerizable laminate which is then exposed imagewise for 10 minutes in a commercial flat-plate exposure unit (40 watt UV fluorescent lamps) under plastic film serving as vacuum frame cover. To develop the crosslinked relief image, the exposed plate is washed for about 5 minutes in a spray washer, using as developer a mixture of 9 parts by volume of tetrachloroethylene and 1 part by volume of n-butanol, the unexposed areas of the layer being dissolved away. The resulting printing element is then dried in a cabinet dryer at 80° C. for one hour. The tacky surface of the relief image is after-treated for 5 minutes in an 0.4% strength aqueous bromine solution and the element is then post-exposed uniformly for 10 minutes in the same exposure unit as before. The printing element is then mounted on a press cylinder by means of a double-coated adhesive film. The surface of the relief printing element is non-tacky and shows excellent affinity for conventional flexographic printing inks. The printed copies obtained faithfully reproduce the original, the edges being sharply defined. The abrasion resistance, swelling, solvent resistance and resilience of the printing plate correspond to that of a conventional rubber plate.

Samples of the photopolymer layer which has been exposed for 30 minutes over its entire surface have a Shore A hardness of 47 and an impact resilience of 48%. Their elongation at break is 341%, the tensile strength being 9.2 N/mm$^2$. The modulus of elasticity at 100% elongation is 1.27 N/mm$^2$ (at 23° C.).

EXAMPLE 2

A flexographic relief printing plate, 2.0 mm thick, is prepared as follows: A 45% strength homogeneous solution, in toluene, of 400 parts of a block copolymer ABC 2, 40 parts of hexane-1,6-diol diacrylate, 35 parts of hexane-1,6-diol dimethacrylate, 6 parts of benzil dimethyl ketal, 0.04 part of the black dye mentioned in Example 1 and 40 parts of a commercial α-methylstyrene/vinyltoluene copolymer is knife-coated onto an 0.125 mm thick polyester base film which has been coated with a commercial two-component polyurethane adhesive, and is then dried for 90 minutes at 80° C. The same solution is also applied, at the same thickness, to a polyester film coated with cyclized rubber as in Example 1, and is also dried. After drying, the two 1 mm thick layers are bonded together in a laminator to form a plate of total thickness 2.0 mm.

The block copolymer ABC 2 which is used has a mean molecular weight of 180,000 and an intrinsic viscosity of 170 ml/g and consists of 8% of polystyrene constituting block A, 76% of polyisoprene constituting block B and 16% of a random copolymer of equal parts of styrene and butadiene constituting block C. The block copolymer has a Shore A hardness of 19 and an impact resilience of 63%. The second order transition point of block C is −19° C.

The unexposed plate is pre-exposed from the back, for 70 seconds, in a flat-plate exposure unit (see Example 1). The polyester covering film is then peeled off the upper surface of the plate and the latter is exposed, using a photographic negative, for 14 minutes through a plastic film, serving as vacuum frame cover, in the same flat-plate exposure unit as above. The plate is then washed out for 10 minutes in a commercial spray washer, using as developer a mixture of 9 parts by volume of tetrachloroethylene and 1 part by volume of n-butanol, and is dried for 1 hour at 80° C. in a through-circulation cabinet dryer. The plate obtained has a relief height of about 0.62 mm, the base, which remains and is polymerized onto the relief, being 1.25 mm thick. The further treatment of the plate is carried out as in Example 1. The printing plate obtained is then mounted on a press cylinder, using a double-coated adhesive film, and is used, with a commercial flexographic printing ink based on an ethanol/ethyl acetate solvent mixture, in a run of more than 100,000 impressions. The plate shows very exact reproduction of all details of the negative and has an excellent press life.

The plate has a Shore A hardness of 42, the exposed layer has an impact resilience of 61%, the modulus of elasticity at 100% elongation is 1.19 N/mm$^2$, the elongation at break is 423% and the tensile strength is 8.1 N/mm$^2$.

EXAMPLE 3

A block copolymer ABC 3 is used, containing 15% of polystyrene as block A, 75% of polyisoprene as block B and 10% of a random copolymer of equal parts of styrene and isoprene as block C. The second order transition point $T_G$ of block C is +5° C. The block copolymer ABC 3 has a molecular weight $\overline{M}_\nu$ of 130,000, an intrinsic viscosity of 122.3 ml/g and an impact resilience of 64%.

A 60% strength by weight solution is prepared by heating 64 parts of block copolymer ABC 3, stabilized with 0.5% of 2,6-di-tert.-butyl-p-cresol, 25 parts of a paraffin oil, 5 parts of 1,1,1-trimethylolpropane triacrylate, 5 parts of butane-1,4-diol dimethacrylate, 1 part of benzil dimethyl ketal and 67 parts of toluene. The solution obtained is poured onto a polyester film which has been coated with a styrene/maleic acid half-ester copolymer, and spread with a doctor blade. After drying in a cabinet dryer at 80° C., the layer is about 2 mm thick; a polyester film, which has been coated with an 0.01 mm thick layer of a two-component polyurethane adhesive, is then laminated onto the layer in such a way that no bubbles of air are trapped between the layer and the film, and the laminate is exposed for 5 minutes, from the side of the last-applied polyester film, in a flat-plate exposure unit (see Example 1). The laminate may be used as an elastomeric base for a multilayer plate. The Shore A hardness of the photopolymer layer is 25 and the impact resilience is 50%.

EXAMPLE 4

To prepare a very tacky adhesive layer, a 10% strength solution, in toluene, of 100 parts of block copolymer ABC 3, 75 parts of a commercial synthetic polyterpene resin serving as tackifying resin, 0.2 part of 2,6-di-tert.-butyl-p-cresol, 15 parts of hexane-1,6-diol diacrylate, 10 parts of hexane-1,6-diol dimethacrylate and 2.5 parts of benzil dimethyl ketal is cast on a polyester film and the toluene is evaporated in a cabinet dryer. The 0.02 mm thick layer obtained is exposed for 2 minutes in a commercial flat-plate exposure unit (see Example 1) and gives a very tacky adhesive layer which adheres well to the base film.

EXAMPLE 5

A multi-layer printing plate with a gradation of hardness from the photopolymerizable relief layer to the soft, resilient base is produced from a photo-crosslinked base as described in Example 3 and a relief-forming layer of the photopolymerizable composition described below, containing the block copolymer ABC 4.

The polyester film of the base, which is already coated on one side with adhesive, is also coated on the free side with a 10 μm thick layer of a polyurethane adhesive. The thickness of this polyester film, coated on both sides with adhesive and serving as a dimensionally stable layer between the relief-forming layer and the base, is 75 μm.

The relief-forming layer is prepared by applying a solution, in toluene, of the photopolymerizable composition specified below to an 0.125 mm thick polyethylene terephthalate film coated with cyclized rubber: 100 parts of a block copolymer ABC 4, stabilized with 0.5% of 2,6-di-tert.-butyl-p-cresol, 9.38 parts of a commercial α-methylstyrene/vinyltoluene copolymer, 8.75 parts of hexane-1,6-diol diacrylate, 5.0 parts of butane-1,4-diol dimethacrylate, 1.5 parts of benzil dimethyl ketal and 0.01 part of the black dye mentioned in Example 1. The block copolymer ABC 4, which contains 8% of polystyrene as block A, 76% of polybutadiene as block B and 16% of a random copolymer of equal parts of styrene and butadiene, having a second order transition point $T_G$ of $-18°$ C., as block C, has a molecular weight $\overline{M}_\nu$ of 130,000, an intrinsic viscosity of 177 ml/g, a Shore A hardness of 37 and an impact resilience of 71%.

To remove the solvent from the layer of photopolymerizable composition dissolved in toluene, the plate is dried for 90 minutes at 90° C. in a through-circulation cabinet dryer. Using a squeegee roller, the 0.7 mm thick layer formed is applied, with its free side, to the side of the base which has been coated with adhesive. To improve the relief image, and to ensure that fine image sections have a broader base, the laminate is pre-exposed from the back, for 40 seconds, in a flat-plate exposure unit (see Example 1). The exposure time is selected by pre-exposing a test strip of the multi-layer plate for periods varying, in steps of 5 seconds, up to 70 seconds, and checking the effect of the pre-exposure on the relief layer by washing out this layer in the same manner as when developing relief layer which has been exposed imagewise. A suitable pre-exposure time is considered to be that at which incipiently polymerized areas of the relief layer are only just not visible.

The polyester covering film is then peeled off the photopolymerizable relief-forming layer and the latter is exposed through a photographic negative for 12 minutes in a flat-plate exposure unit. During this operation, the negative is pressed tightly against the plate surface by the plastic cover sheet of the exposure unit. For developing, the exposed plate is washed out in a commercial spray washer at 30° C., using as developer a mixture of 9 parts by volume of tetrachloroethylene and 1 part by volume of n-butanol. Drying, after-treatment and post-exposure are carried out in the same manner as in Example 1.

Samples of the photopolymerizable relief layer which has been exposed over its entire surface for 30 minutes have a Shore A hardness of 59 and an impact resilienece of 75%. The modulus of elasticity at 100% elongation is 2.15 N/mm², the elongation is 310% and the tensile strength is 7.27 N/mm². Proof prints made with this plate faithfully reproduce the original, with only slight shifts in tonal value.

EXAMPLE 6

To prepare a multi-layer plate according to Example 5, a photopolymerizable relief-forming layer is prepared from a block copolymer ABC 5 containing 17% of polystyrene as block A, 73% of polyisoprene as block B and 10% of a random copolymer, of equal parts of isoprene and styrene (second order transition point $T_G = +6°$ C.) as block C. The block copolymer ABC 5 has a mean molecular weight of 160,000, an intrinsic viscosity of 146.8 ml/g, a Shore hardness of 25 and an impact resilience of 68%.

88 parts of block copolymer ABC 5, 11 parts of tripropylene glycol diacrylate, 1 part of benzil dimethyl ketal and 0.006 part of the black dye mentioned in Example 1 are dissolved in 100 parts of toluene at 80° C. and the solution is cast on a 125 μm thick polyethylene terephthalate base film coated with cyclized rubber (see Example 1), the amount applied being such that after drying for 1 hour at 90° C. and 0.7 mm thick dry layer remains. The latter is then laminated onto a resilient and flexible base layer, as described in Example 3, in a laminator but before this the free surface of the polyester film, whose other side has already been bonded to the elastomeric base with adhesive, is coated with the same adhesive. Samples of the photopolymer layer which has been exposed for 30 minutes have a Shore A hardness of 38, an impact resilience of 60%, an elongation at break of 307%, a tensile strength of 6.5 N/mm² and a modulus of elasticity of 1.65 N/mm² at 100% elongation. Thereafter, the plate is further processed as described in Example 5.

We claim:

1. A photopolymerizable composition which contains
   (a) not less than 40% by weight of at least one elastomeric block copolymer which is soluble in developer solutions and has the structure A-B-C, where A, B and C are different polymer blocks linked chemically to one another, in which (a1) the polymer block A, accounting for from 5 to 25% by weight of the block copolymer, is prepared by polymerizing at least one styrene monomer of the formula $CH_2=CRR'$ where R is hydrogen or methyl and R' is phenyl or $C_1-C_4$-alkyl-substituted phenyl, and has a second order transition point above $+25°$ C.,
   (a2) the polymer block B which accounts for from 15 to 90% by weight of the block copolymer is prepared by polymerizing at least one aliphatic diene hydrocarbon of 4 or 5 carbon atoms and has a second order transition point below $-20°$ C., and
   (a3) the polymer block C which accounts for from 5 to 60% by weight of the block copolymer is prepared by homopolymerization or copolymerization of aliphatic diene hydrocarbons of 4 or 5 carbon atoms or by random copolymerization of at least one aliphatic diene hydrocarbon of 4 or 5 carbon atoms with at least one styrene monomer of the formula $CH_2=CRR'$, where R is hydrogen or methyl and R' is phenyl or $C_1-C_4$-alkyl-substituted phenyl, and has a second order transition point of from $-20°$ C. to $+15°$ C.
   (b) not less than 1% by weight of at least one photopolymerizable olefinically unsaturated monomer compatible with the block copolymer (a) and
   (c) from 0.1 to 10% by weight of at least one photopolymerization initiator.

2. A photopolymerizable composition as claimed in claim 1, which contains a block copolymer having the structure A-B-C, in which the polymer block C is incompatible with the polymer block A.

3. A photopolymerizable composition as claimed in claim 1, which contains a block copolymer A-B-C, in which the polymer block C is a polybutadiene block exhibiting more than 70% by weight of 1,2-configuration and having a mean molecular weight of from 10,000 to 90,000.

4. A photopolymerizable composition as claimed in claim 1, which contains a block copolymer A-B-C, in which the polymer block C is a polyisoprene block exhibiting more than 40% by weight of 3,4-configuration and having a mean molecular weight of from 10,000 to 90,000.

5. A photopolymerizable composition as claimed in claim 1, which contains a block copolymer A-B-C, in which the polymer block C is a random copolymer block which contains from 70 to 30% by weight of at least one diene hydrocarbon of 4 or 5 carbon atoms as copolymerized units and from 30 to 70% by weight of a styrene monomer of the formula $CH_2=CRR'$, where R is hydrogen or methyl and R' is phenyl or $C_1-C_4$-alkyl-substituted phenyl, as copolymerized units, and which has a second order transition point of from $-20°$ C. to $+15°$ C.

6. A photopolymerizable composition as claimed in claim 5, wherein the polymer block C accounts for from 5 to 35% by weight of the block copolymer A-B-C.

7. A photopolymerizable composition as claimed in any of claims 1 to 6, in which the block copolymer A-B-C has an intrinsic viscosity in the range of from about 60 to 350 ml/g, measured on an 0.5% strength by weight solution in toluene at 25° C.

8. A photopolymerizable composition as claimed in claim 1, which additionally contains admixed compatible tackifying resins.

9. A photopolymerizable composition as claimed in claim 1, which additionally contains admixed plasticizer.

10. Photo-curable elements possessing a photopolymerizable layer on a base, wherein the photopolymerizable layer consists of a photopolymerizable composition as claimed in claim 1.

* * * * *